United States Patent [19]
Hsue

[11] Patent Number: 5,416,036
[45] Date of Patent: May 16, 1995

[54] METHOD OF IMPROVEMENT ESD FOR LDD PROCESS

[75] Inventor: Chen-Chiu Hsue, Hsin-Chu, Taiwan, Prov. of China

[73] Assignee: United Microelectronics Corporation, Hsinchu, Taiwan, Prov. of China

[21] Appl. No.: 131,373

[22] Filed: Oct. 4, 1993

[51] Int. Cl.⁶ .................. H01L 21/70; H01L 27/00
[52] U.S. Cl. ........................ 437/51; 437/44; 437/54
[58] Field of Search ............ 437/44, 34, 51, 54; 257/173–174, 328, 355–360, 493, 369, 339

[56] References Cited

U.S. PATENT DOCUMENTS

| | | | |
|---|---|---|---|
| 4,753,898 | 6/1988 | Parrillo | 437/34 |
| 5,087,582 | 2/1992 | Campbell et al. | 437/44 |
| 5,142,345 | 8/1992 | Miyata | 357/23.13 |
| 5,246,872 | 9/1993 | Mortensen | 437/51 |

FOREIGN PATENT DOCUMENTS 4-79265(A) 3/1992 Japan .................. 257/355

Primary Examiner—Olik Chaudhuri
Assistant Examiner—H. Jey Tsai
Attorney, Agent, or Firm—George O. Saile; Stephen B. Ackerman

[57] ABSTRACT

A method of forming an ESD protection device simultaneously with an integrated circuit which includes FET devices is described. A silicon substrate on which there are field oxide regions, gates, and active regions is provided. A first ion implant in a vertical direction is performed of a conductivity-imparting dopant, into the active regions of the ESD protection device and the FET devices. An insulating layer is formed over the ESD protection device and the FET devices, and over the field oxide regions. The insulating layer is patterned to create spacers adjacent to the gates of both the ESD protection device and the FET devices. The spacers are removed from the gate of the ESD protection device. A second ion implant in a vertical direction is performed of a conductivity-imparting dopant with higher concentration than dopant from the first ion implant, into active regions of both the ESD protection device and the FET devices.

10 Claims, 10 Drawing Sheets

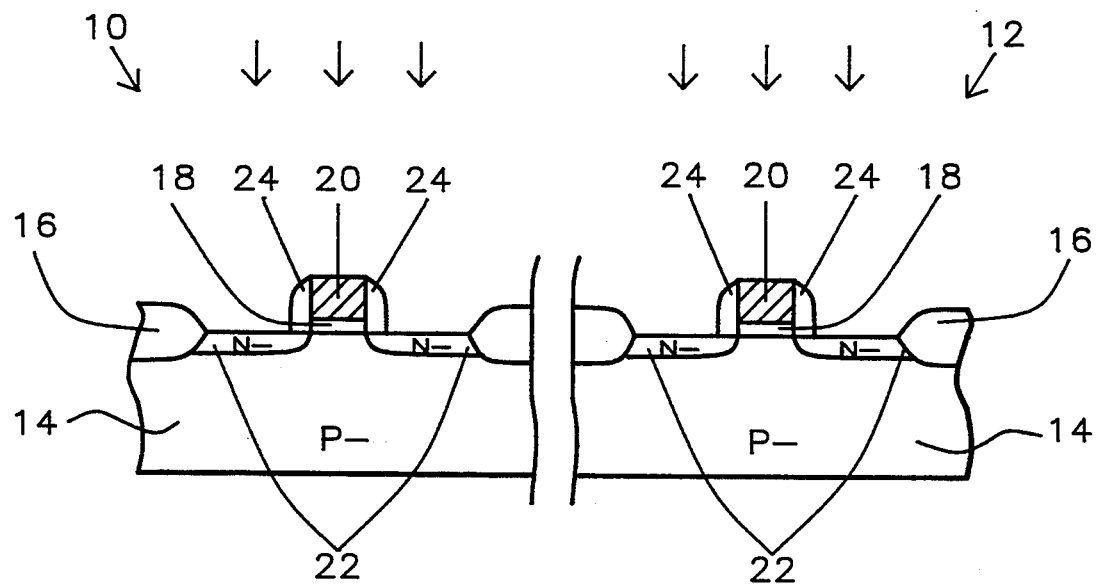
FIG. 3
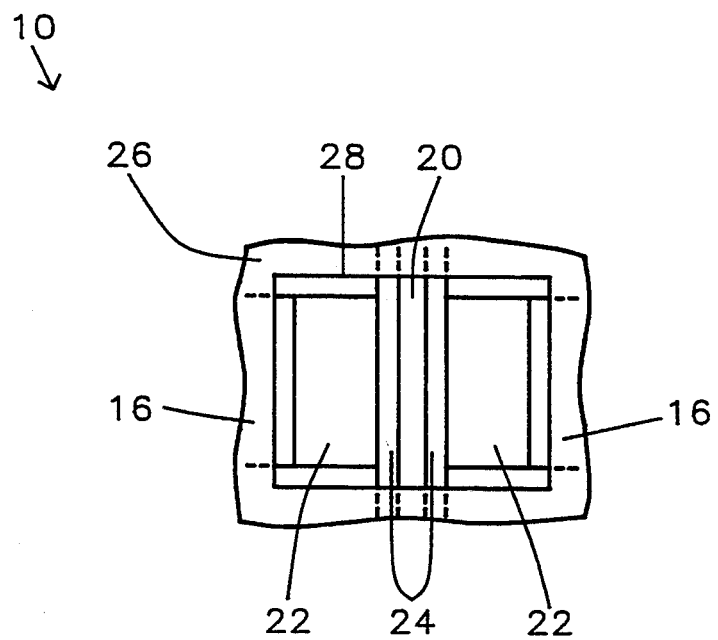
FIG. 4 – Prior Art

METHOD OF IMPROVEMENT ESD FOR LDD PROCESS

RELATED PATENT APPLICATION

1) "A Method for ESD Protection Improvement", inventors C. C. Hsue, Joe Ko, docket number UMC2-93-036.

BACKGROUND OF THE INVENTION (1) Field of the Invention

The invention relates to the manufacture of highly dense integrated circuits, and more particularly to input protection devices to protect attached integrated circuits from damage due to electrostatic discharge.

(2) Description of the Related Art

During handling and operation of integrated circuit devices using Field Effect Transistor (FET) technology, large electrostatic charges can be transferred from external contacts of the integrated circuit into the interior of the circuit, causing damage and/or destruction to FET devices within. In order to prevent such damage, workers in the field have added input protection devices which are typically located between the external contacts and the FET devices. These protection devices are designed to provide a path to safely discharge the electrostatic charge and prevent damage to the internal FET devices.

One such device is shown in U.S. Pat. No. 5,142,345 by Miyata. In this invention, an input protection device is formed and later connected to an internal FET device and a memory structure, which it is designed to protect from electrostatic discharge (ESD). The input protection device is itself an FET device. The protection device's source/drain regions are formed with a single heavy ion implant during separate processing steps from the formation of the source/drain regions for the connected internal devices. Spacers are formed on the gates of both the internal and the protection devices, since the internal devices are formed using LDD (lightly doped drain) regions that require the spacers for one ion implant step.

SUMMARY OF THE INVENTION

It is a principal object of this invention to provide a simplified method for forming an ESD protection device to protect an attached integrated circuit from damage due to electrostatic discharge, simultaneously with the formation of the attached integrated circuit.

This object is achieved by forming an ESD protection device simultaneously with an integrated circuit which includes FET devices, on a silicon substrate on which there are field oxide regions, gates, and active regions. A first ion implant in a vertical direction is performed of a conductivity-imparting dopant, into the active regions of the ESD protection device and the FET devices. An insulating layer is formed over the ESD protection device and the FET devices, and over the field oxide regions. The insulating layer is patterned to create spacers adjacent to the gates of both the ESD protection device and the FET devices. The spacers are removed from the gate of the ESD protection device. A second ion implant in a vertical direction is performed of a conductivity-imparting dopant with higher concentration than dopant from the first ion implant, into active regions of both the ESD protection device and the FET devices.

It is a further object of this invention to provide a structure of an ESD protection device to protect an attached integrated circuit which includes FET devices from damage due to electrostatic discharge.

This object is achieved by providing field oxide regions that are located in and on a silicon substrate, for isolation of the ESD protection devices and the FET devices. A gate for the ESD protection device is formed between field oxide regions. Source/drain regions for the ESD protection device are located between the gate and the field oxide regions, and are formed with a heavy ion implant. Gates for the FET devices are also located between field oxide regions, and have adjacent spacers. Source/drain regions for the FET devices are located between the FET device gate and the field oxide regions, and are formed with a light ion implant under the spacers, and a heavier ion implant in the remainder of the FET source/drain regions.

BRIEF DESCRIPTION OF THE DRAWINGS

FIGS. 1 to 3 are cross-sectional views of the simplified method of the invention for forming an ESD protection device to protect an attached integrated circuit from damage due to electrostatic discharge.

FIGS. 4 and 5 are top views of the prior art method and invention method, respectively, of forming a mask during the formation of an ESD protection device.

DESCRIPTION OF THE PREFERRED EMBODIMENTS

Figure 1:
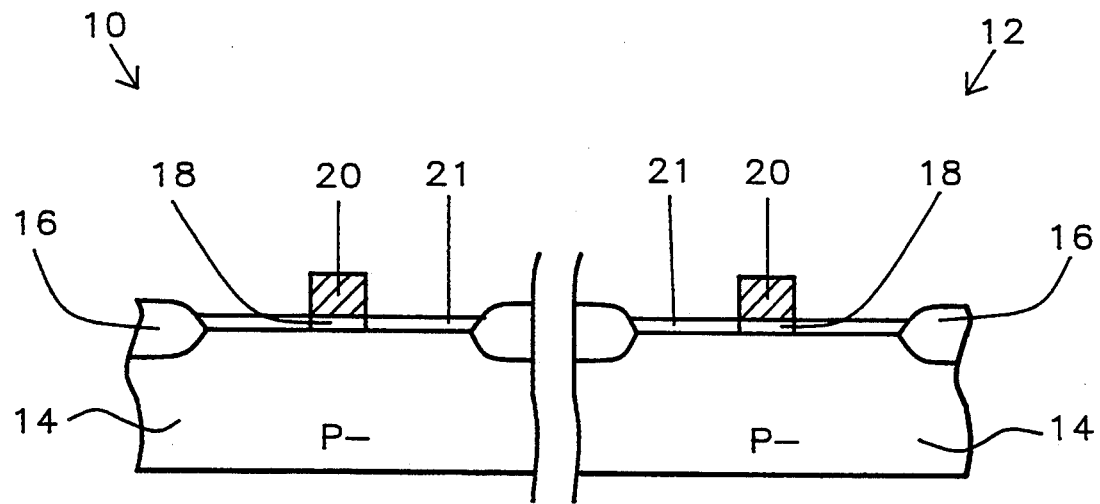

Referring now to FIG. 1, there is shown an ESD protection device 10 and an internal FET device 12. Both devices are formed at the same time on a single P-substrate 14. Field oxide regions 16 are formed in a conventional manner, for example, by the LOCOS technique, and serve to isolate devices from one another. A gate oxide layer is formed by thermal growth of the silicon substrate, as is well known in the art, to a thickness of between about 70 and 350 Angstroms. A gate layer is then deposited conformally, to a thickness of between about 1500 and 4500 Angstroms, and is typically a polysilicon or polycide. The gate layer is then patterned by conventional lithography and etching, to form a gate electrode for each device consisting of gate oxide 18 and gate 20. A thin pad oxide layer 21 is formed by low-pressure chemical vapor deposition to protect the substrate surface.

Figure 2:
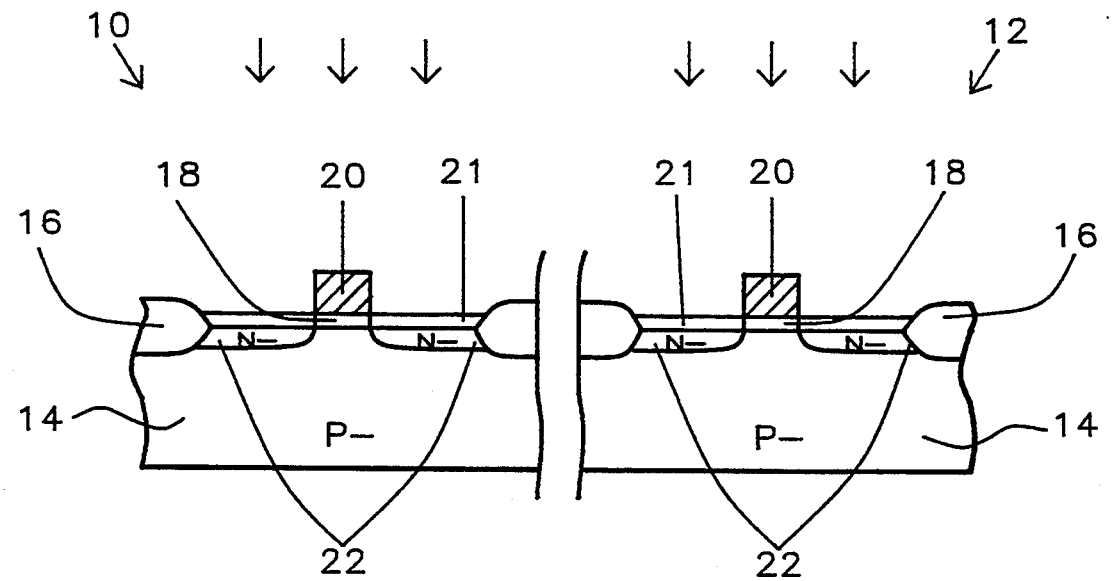

With reference to FIG. 2, a first ion implant is performed using phosphorus P31 at a concentration of between about 1 E 13 and 1 E 14 atoms/cm.$^2$. This forms N−regions 22, in the source and drain regions of the protection device 10 and internal FET device 12, with the N−regions being self-aligned due to the use of the gate as a mask.

Referring now to FIG. 3, a conformal insulating layer of, for instance, silicon oxide, is deposited over the entire work surface by chemical vapor deposition (CVD) to a thickness of between about 1000 and 3000 Angstroms. This layer can also be nitride or polysilicon. The layer is then patterned by an anisotropic reactive ion etch to form spacers 24 on the sides of the device gates, as is well known in the art. The pad oxide layer 21 is removed at the same time.

Shown in FIG. 4 is a top view ESD protection device 10 of the FIG. 3 structure with a photoresist mask 26 and mask opening 28 of the prior art, in which the mask would be used for a separate high-current ion implant of the ESD device active regions. As can be seen, a typical resist mask opening 28 for the prior art ion implant is somewhat larger, when viewed from the FIG. 4 top view perspective, than the active regions 22.

Figure 5:
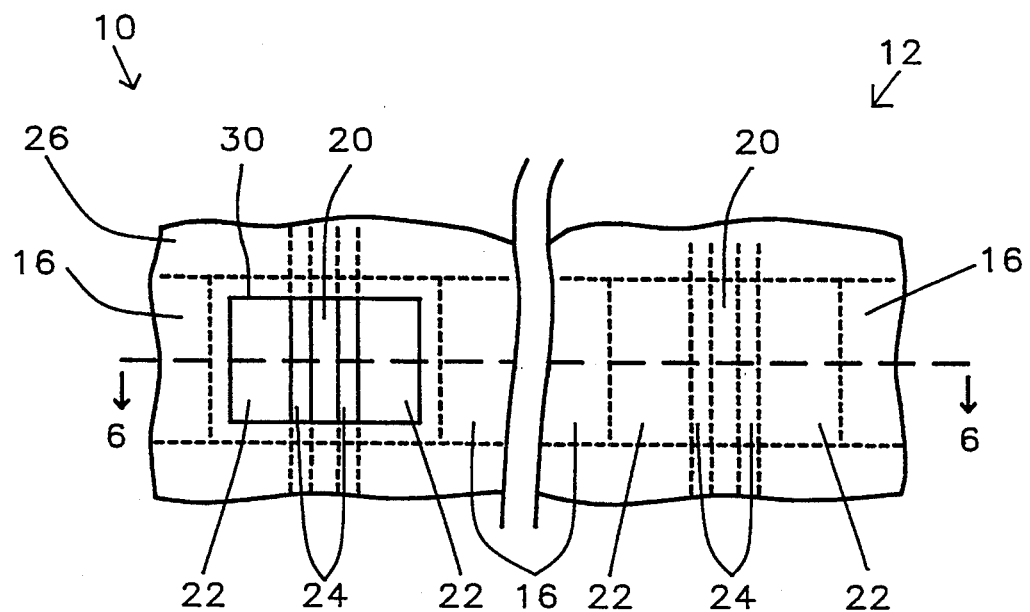
Figure 6:
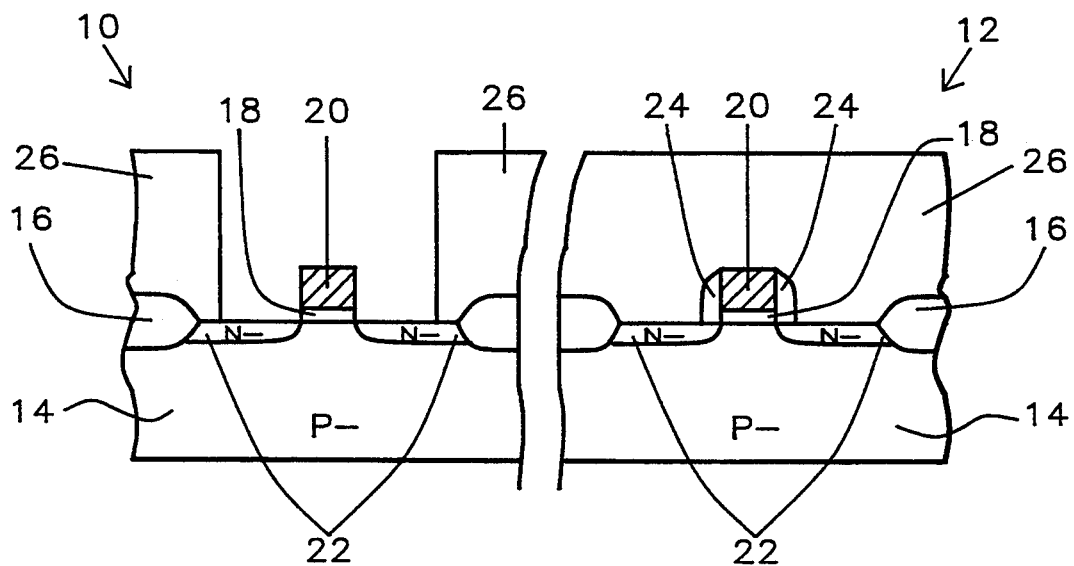
FIGS. 6–9, 9A and 10–16 are further cross-sectional views of the simplified method of the invention for forming an ESD protection device to protect an attached integrated circuit from damage due to electrostatic discharge.

Referring now to FIG. 5, a smaller mask opening 30 is formed by conventional lithography and etching over ESD protection device 10. This smaller mask opening will be used for etching spacers 24 from the ESD device. Photoresist 26 masks the entire internal FET device 12. The ESD device spacers are then etched by an oxide wet dip of buffered oxide etchant (BOE) for between about 0.5 and 2 minutes, at a temperature of between about 20° and 30° C. This etch could also be accomplished with an oxide dry etch, as is well understood in the art. The spacers are not needed in the ESD protection device because the N-lightly doped drain (LDD) structure would degrade the device's ESD protection characteristics. A cross-sectional view of the FIG. 5 structure along line 6—6 is shown in FIG. 6, with spacers 24 removed from the ESD protection device 10. The photoresist 26 is then removed by conventional means.

Figure 7:
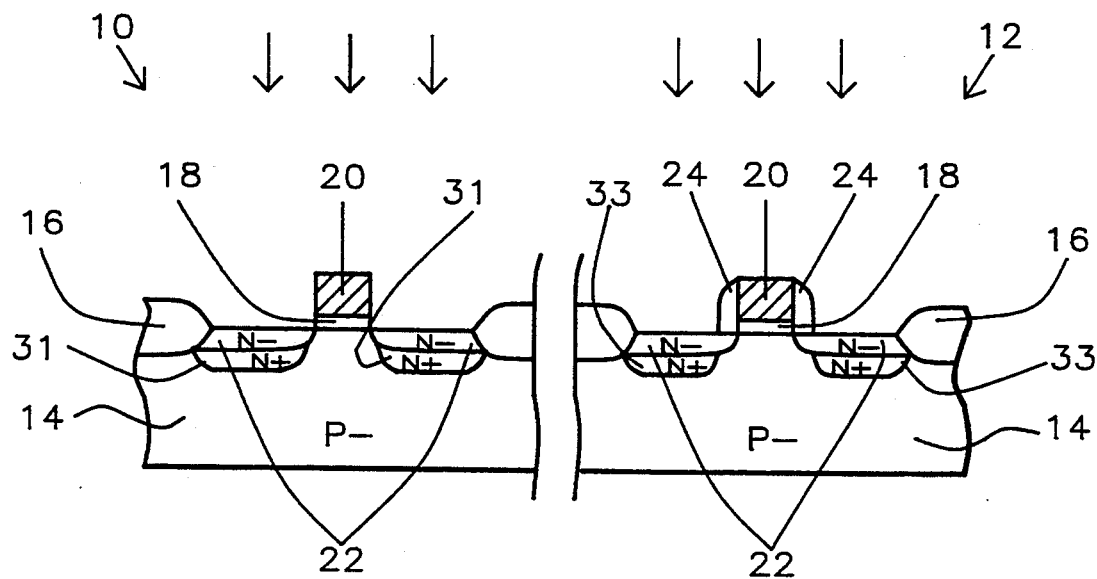

With reference to FIG. 7, in a critical step of the invention, a heavy ion implant is now performed simultaneously in both the ESD protection device 10 and the internal FET devices 12. This eliminates the need for the separate implant steps of the ESD and internal devices of the prior art. The ion implant is with arsenic AS75, at a concentration of between about 1 E 15 and 6 E 15 atoms/cm.$^2$. In the ESD protection device 10, this results in N+regions 31, and in the internal FET devices, N+regions 33 result. A drive-in step is then performed by heating to a temperature of between about 750° and 950° C. for between about 10 and 60 minutes.

Figure 8:
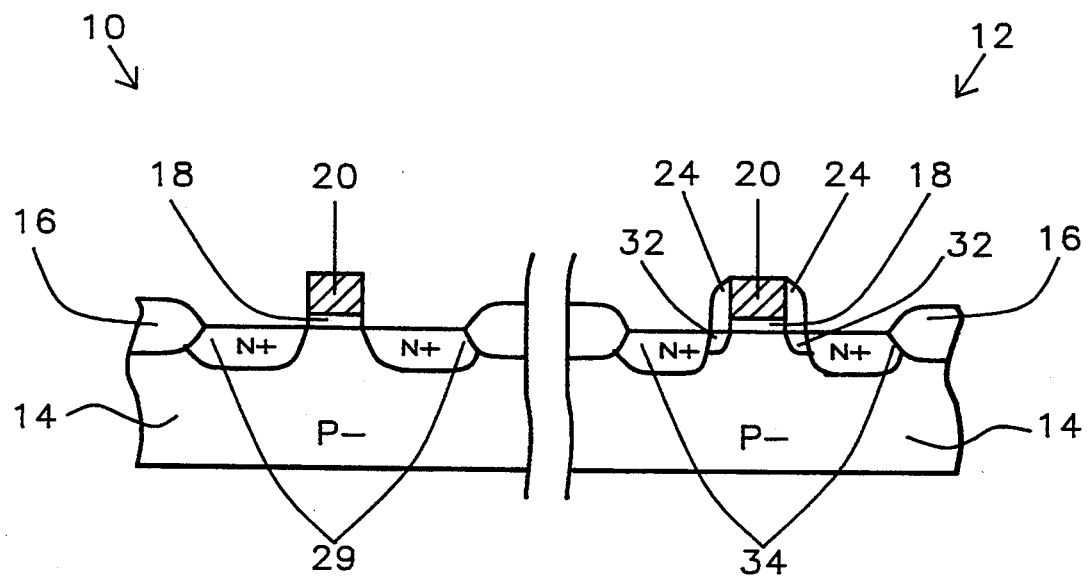

The resultant structure is shown in FIG. 8. Due to the drive-in, the N+regions 29 in the ESD device 10 completely diffuse to form the source/drain regions and eliminate the former N−regions. The source/drain regions of the internal FET device 12 as shown are a conventional lightly doped drain (LDD) structure, with N−regions 32 under the spacers 24, and N+regions 34.

Figure 9:
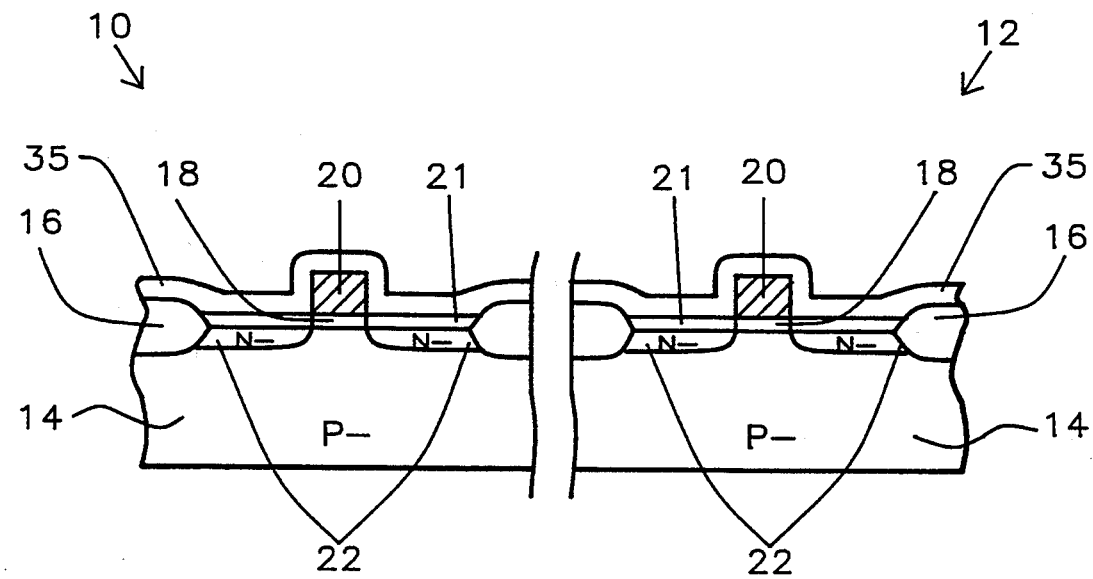
Figure 10:
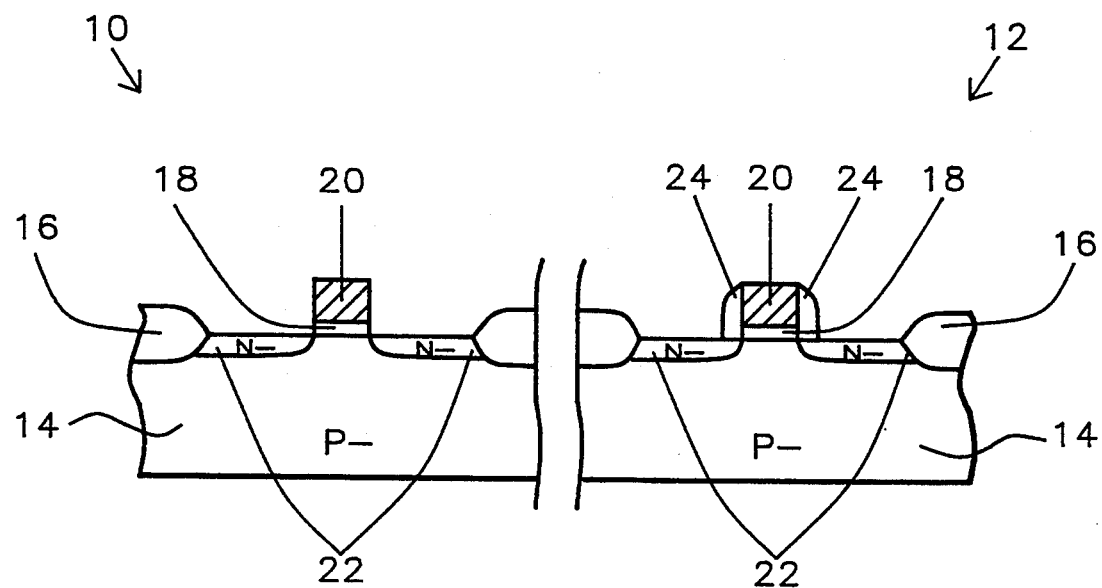

A second method of the invention is now described, and is shown in FIGS. 9 and 10. Processing is the same as in the first method up to the formation of the FIG. 2 structure. Referring now to FIG. 9, a conformal insulating layer 35 of, for instance, silicon oxide, is deposited over the entire work surface by chemical vapor deposition (CVD) to a thickness of between about 1000 and 3000 Angstroms, as in the first method. This layer can also be nitride or polysilicon.

Figure 9A:
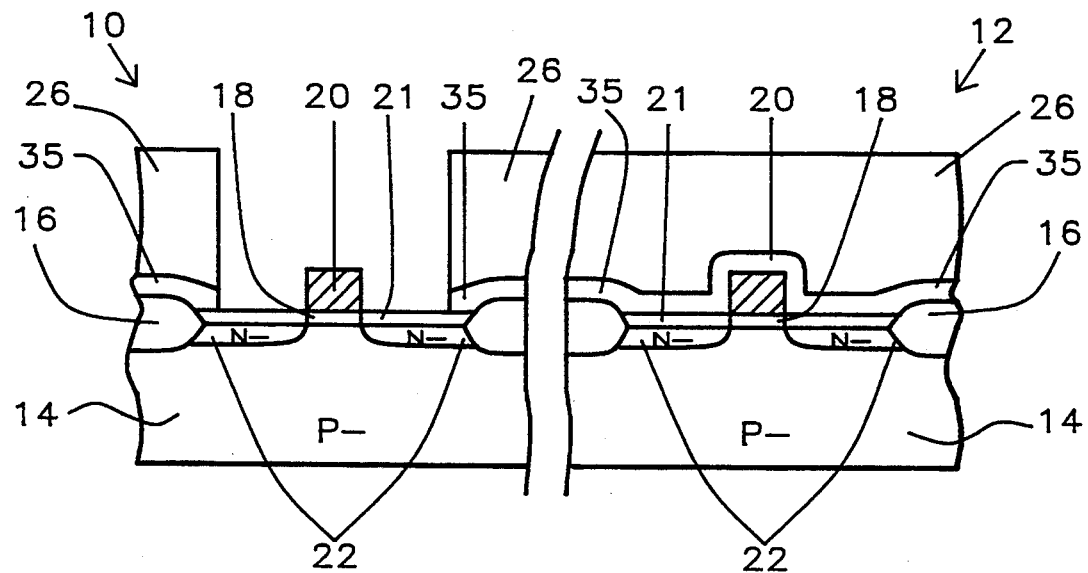

In the key difference from the first method, the oxide layer 35 is removed from the ESD device 10 area prior to spacer formation. Referring to FIG. 9a, photoresist mask 26 is formed, with a smaller mask opening to the ESD device 10 as in the first method, and completely masking the internal FET 12. Oxide layer 35 is removed from the unmasked region by a wet etch using buffered oxide etchant (BOE) for between about 0.5 and 2 minutes, at a temperature of between about 20° and 30° C. As in the first method, this may also be accomplished with an oxide dry etch.

As shown in FIG. 10, the photoresist is removed, and layer 35 is then patterned by an anisotropic reactive ion etch to form spacers 24 on the sides of the device gates of the internal FET devices 12. The remainder of layer 35 in the area of the ESD device 10 is removed during this etch, as well as pad oxide 21. Processing now continues in exactly the same way as in the first method, with the simultaneous heavy ion implant in both sets of devices as in FIG. 7, and a drive-in step, with the same resultant structure as shown in FIG. 8.

While the above two methods were described with respect to an NMOS device in which N implants were used with a P-substrate, it is well understood by those skilled in the art that a PMOS device could similarly have been formed by using an N substrate, and dopants of an opposite conductivity to form P-doped source/drain regions.

The invention has further advantages and can also be used for CMOS devices. Since CMOS involves both N and P-type dopants, the use of simultaneous high-current ion implants of the ESD device and the internal CMOS devices reduces the number of processing steps to a greater extent than for NMOS or PMOS structures. This can be more readily understood with respect to FIGS. 11 to 18.

Figure 11:
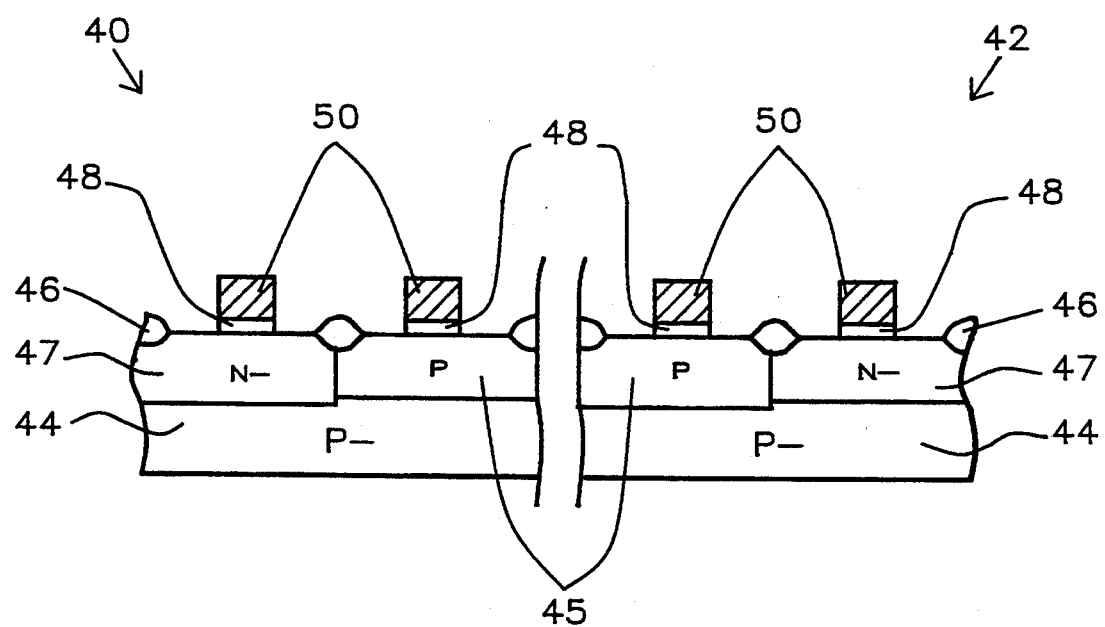

Referring to FIG. 11, there is shown an ESD protection device 40 and an internal CMOS device 42. Both devices are formed at the same time on a single P-substrate 44. P-well regions 45 and N-well regions 47 are formed as is well known in the art. Field oxide regions 46 are formed in a conventional manner, for example, by the LOCOS technique. A gate oxide layer is formed by thermal growth of the silicon substrate to a thickness of between about 70 and 350 Angstroms. A gate layer is then deposited conformally, to a thickness of between about 1500 and 4500 Angstroms, and is typically polysilicon or polycide. The gate layer is then patterned by conventional lithography and etching, to form a gate electrode for each device consisting of gate oxide 48 and gate 50.

Figure 12:
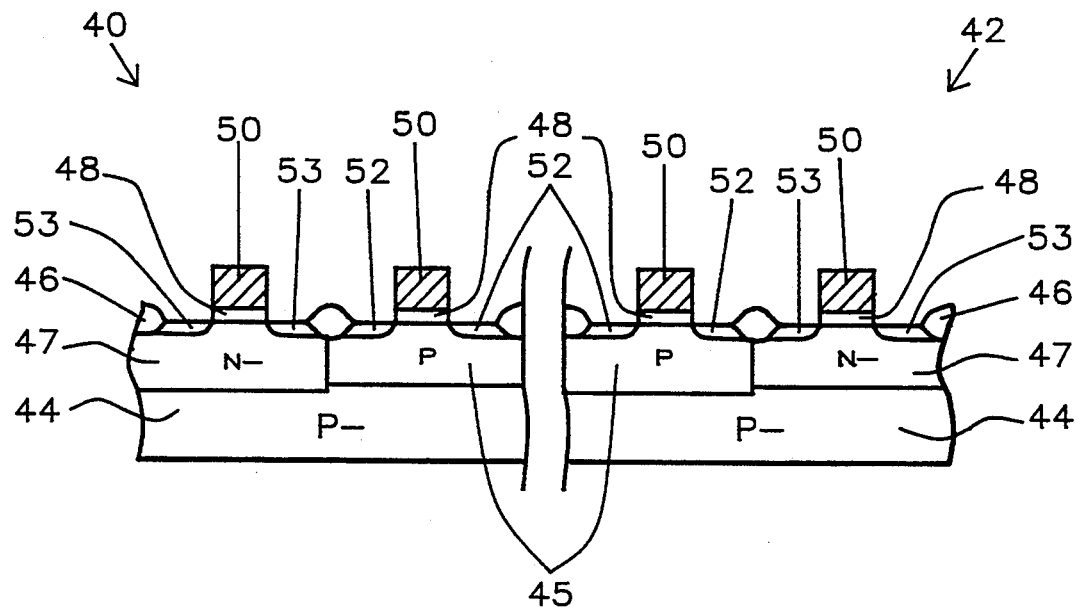

Referring now to FIG. 12, a first ion implant is performed using phosphorus P31 at a concentration of between about 1 E 13 and 1 E 14 atoms/cm.$^2$. This forms N−regions 52, in the source and drain regions of the N-channel for protection device 40 and internal CMOS device 42. A similar ion implant using boron B11 at a concentration of between about 5 E 12 and 5 E 13 atoms/cm.$^2$ is performed to form the P−regions 53 of the P-channel for the devices.

Figure 13:
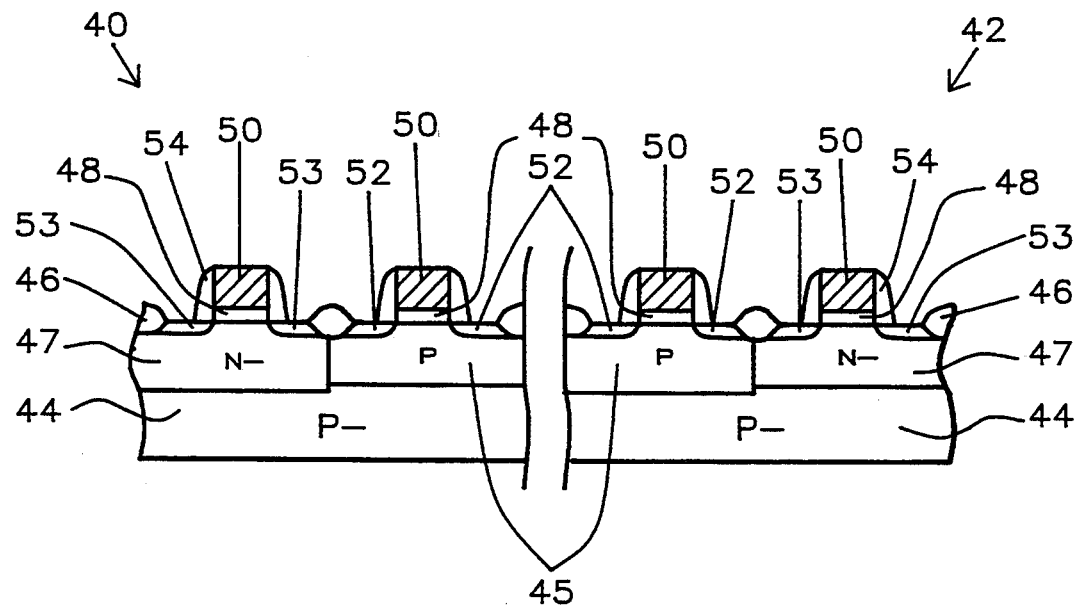

With reference to FIG. 13, a conformal insulating layer of, for instance, silicon oxide, is deposited over the entire work surface by chemical vapor deposition (CVD) to a thickness of between about 1000 and 3000 Angstroms. This layer is then patterned by an anisotropic reactive ion etch to form spacers 54 on the sides of the device gates. as is well known in the art.

Figure 14:
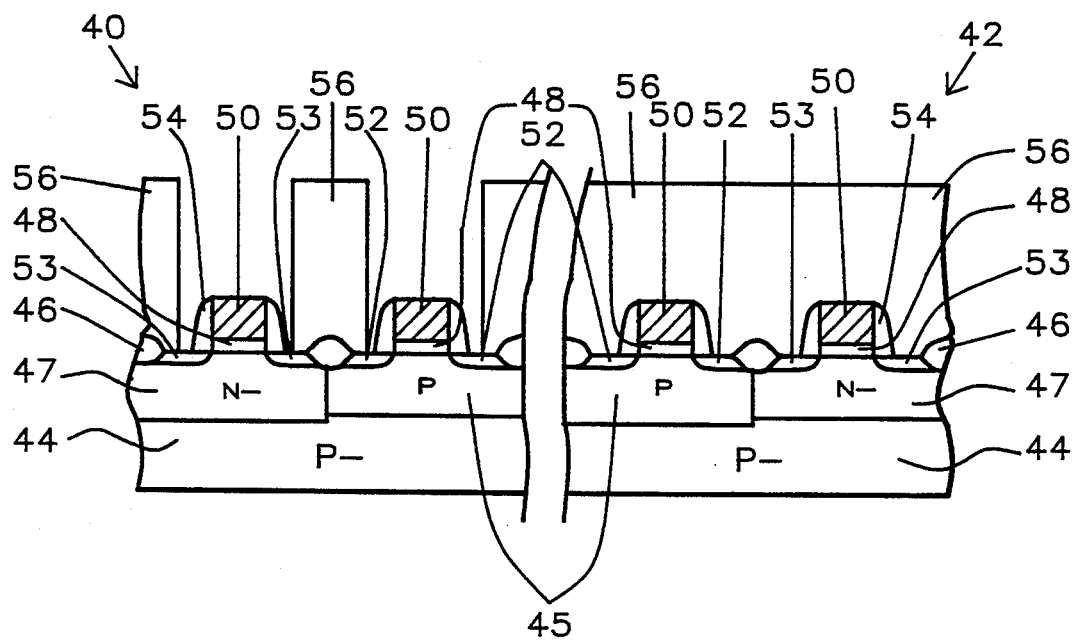

Referring now to FIG. 14, a small opening photoresist mask 56 is formed, by conventional lithography and etching, to prepare for oxide etch of spacers 54 of the ESD protection device as in the NMOS description first method above. Photoresist 56 masks the entire internal CMOS device 42. The ESD device spacers are then etched by an oxide wet dip of BOE for between about 0.5 and 2 minutes, at a temperature of between about 20° and 30° C. The photoresist 56 is then removed by conventional means.

Figure 15:
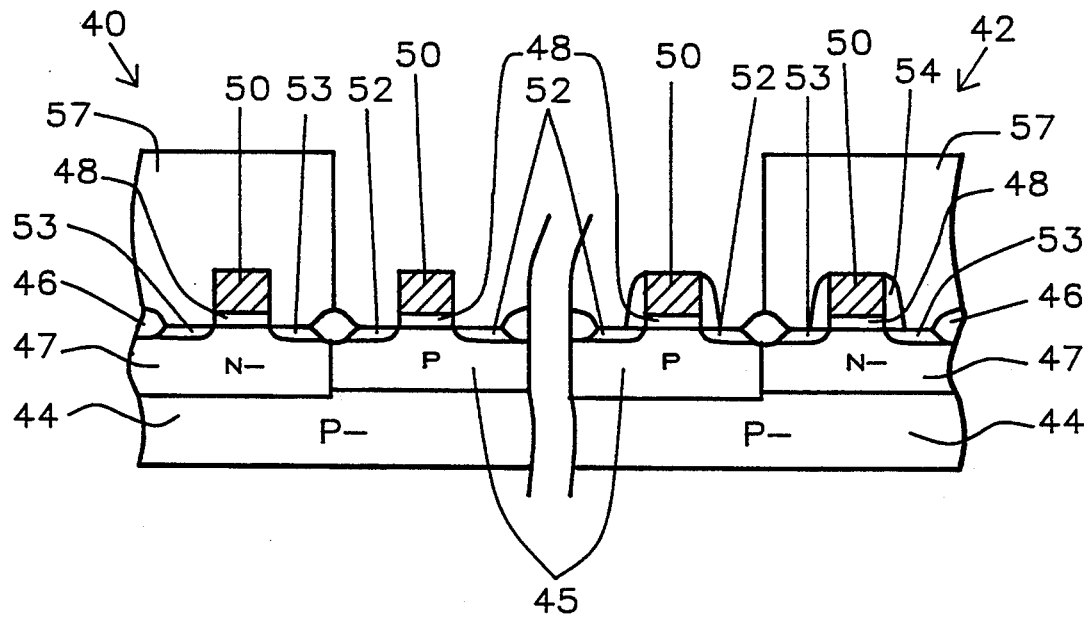
Figure 16:
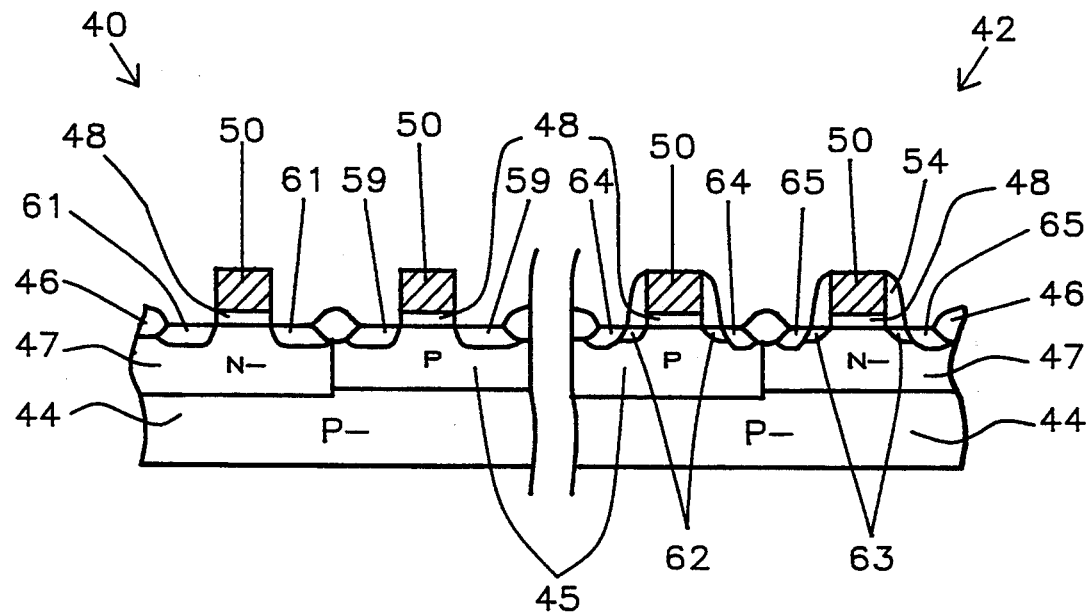

With reference to FIG. 15, in a critical step of the invention, heavy ion implants are now performed simultaneously in both the ESD protection device 40 and the internal CMOS devices 42. Two high-current implants—an N+implant and a P+implant—replace the four high-current implants—N+ and P+ for the ESD device, and N+ and P+ for the internal CMOS devices—of the prior art. With the P-channel devices masked by photoresist 57, an N+ion implant is performed with arsenic AS75, at a concentration of between about 1 E 15 and 6 E 15 atoms/cm.$^2$. Then with the N-channel devices masked (not shown), a P+ion implant is performed with boron B11, at a concentration of between about 1 E 15 and 6 E 15 atoms/cm.$^2$. A drive-in step is then performed by heating to a temperature of between about 750° and 950° C. for between about 10 and 60 minutes. The resultant structure is shown in FIG. 16.

N+regions 59 and P+regions 61 in the ESD device completely diffuse to form the source/drain regions. The source/drain regions of the internal CMOS device as shown are conventional lightly doped drain (LDD) structures, with N−regions 62 and P−regions 63 under the spacers 54, and N+regions 64 and P+regions 65.

Figure 17:
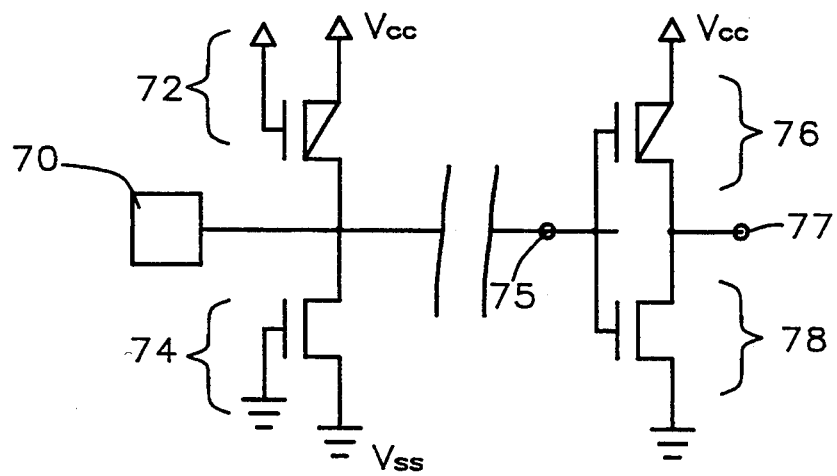
FIGS. 17 and 18 are a circuit schematic and the associated cross-sectional view of an ESD protection device and CMOS device formed by the inventive method.
Figure 18:
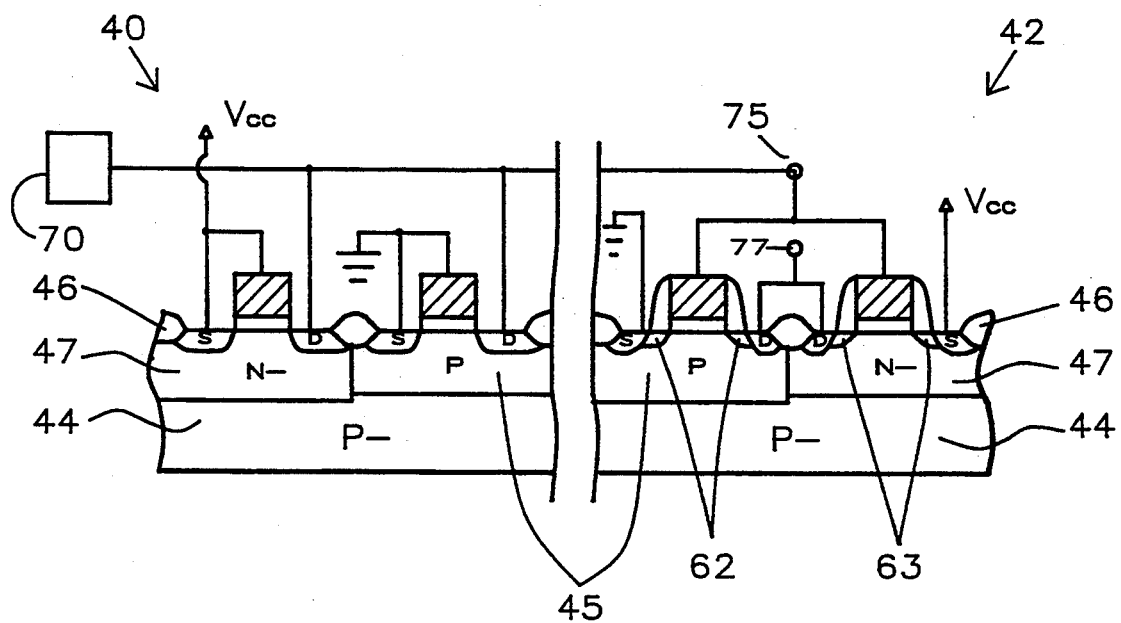

The devices shown in the previous figures are shown in the circuit diagrams of FIGS. 17 and 18. Referring to FIG. 17, an ESD protection device 40 is shown connected to input, or output, (I/O) pad 70. It is through the pad 70 that electrostatic charges may enter the integrated circuit from an exterior source such as a person handling the circuit. The P-channel transistor 72 has its gate and source connected to Vcc, a voltage source. The P-channel drain is connected to the drain of the N-channel transistor 74, and to the I/O pad 70, as well as to the internal circuit the ESD device is designed to protect. The N-channel transistor 74 has its gate and source connected to ground.

A CMOS inverter is shown as internal CMOS device 42. This inverter has its input 75 connected to the gates of P-channel transistor 76 and N-channel transistor 78. The P-channel source is connected to Vcc, while the N-channel source is connected to ground. The drains of the two transistors are connected together and provide the output terminal of the inverter. A cross-sectional representation of the FIG. 17 circuit, and connections, is shown in FIG. 18.

While the invention has been particularly shown and described with reference to the preferred embodiments thereof, it will be understood by those skilled in the art that various changes in form and details may be made without departing from the spirit and scope of the invention.

What is claimed is:

1. A method of forming an ESD protection device simultaneously with an integrated circuit which includes FET devices, on a silicon substrate on which there are field oxide regions, gates, and active regions, comprising the steps of:

performing a first ion implant in a vertical direction of a conductivity-imparting dopant into said active regions of the ESD protection device and the FET devices, using the gates of said ESD protection device and said FET device as masks;

forming an insulating layer over said ESD protection device and said FET devices, and over said field oxide regions;

patterning said insulating layer to create spacers adjacent to said gates of both said ESD protection device and said FET devices;

removing said spacers from said gate of said ESD protection device; and performing a second ion implant in a vertical direction of a conductivity-imparting dopant with higher concentration than dopant from said first ion implant, after said removing spacers from said ESD protection device, into active regions of both said ESD protection device and said FET devices.

2. The method of claim 1 wherein said removing of said spacers is by a wet etch.

3. The method of claim 1 wherein said removing of said spacers is by a dry etch.

4. The method of claim 1 wherein said patterning of said insulating layer is by an anisotropic etch.

5. The method of claim 1 wherein both said devices are NMOS devices.

6. The method of claim 5 wherein said first ion implant is with phosphorus P31 at a dosage of between about 1 E 13 and 1 E 14 atoms/cm.$^2$.

7. The method of claim 5 wherein said second ion implant is with arsenic AS75 at a dosage of between about 1 E 15 and 6 E 15 atoms/cm.$^2$.

8. The method of claim 1 further comprising the step of driving in said ion implants by heating to a temperature of between about 750° and 950° C., causing said conductivity-imparting dopant with higher concentration to completely fill said ESD protection device active regions.

9. A method of forming an ESD protection device simultaneously with an integrated circuit which includes FET devices, on a silicon substrate on which there are field oxide regions, gates, and active regions, comprising the steps of:

performing a first ion implant in a vertical direction of a conductivity-imparting dopant into said active regions of the ESD protection device and the FET devices, using the gates of said ESD protection device and said FET device as masks;

forming an insulating layer over said ESD protection device and said FET devices, and over said field isolation regions;

removing said insulating layer from said ESD protection device;

patterning said insulating layer to create spacers adjacent to said gate electrodes of said FET devices; and performing a second ion implant in a vertical direction of a conductivity-imparting dopant with higher concentration than dopant from said first ion implant, after said removing said insulating layer from said ESD protection device into active regions of both said ESD protection device and said FET devices.

10. The method of claim 9 further comprising the step of driving in said ion implants by heating to a temperature of between about 750° and 950° C., causing said conductivity-imparting dopant with higher concentration to completely fill said ESD protection device active regions.

* * * * *